United States Patent

Chahabadi et al.

[11] Patent Number: 5,535,280
[45] Date of Patent: Jul. 9, 1996

[54] CIRCUIT FOR REMOVING IGNITION NOISE FROM A MULTIPLEX SIGNAL

[75] Inventors: Djahanyar Chahabadi, Hildesheim; Lothar Vogt, Hohenhameln, both of Germany

[73] Assignee: Blaupunkt-Werke GmbH, Hildesheim, Germany

[21] Appl. No.: 288,554

[22] Filed: Aug. 10, 1994

[30] Foreign Application Priority Data

Sep. 11, 1993 [DE] Germany .......................... 43 30 892.9

[51] Int. Cl.⁶ .................................................. H04H 5/00
[52] U.S. Cl. .................................................. 381/13; 381/94
[58] Field of Search .................................. 381/13, 94, 123

[56] References Cited

U.S. PATENT DOCUMENTS

| | | | |
|---|---|---|---|
| 4,426,727 | 1/1984 | Hamada | 381/13 |
| 4,574,390 | 3/1986 | Hirobashi et al. | 381/13 |
| 4,769,840 | 9/1988 | Saisho | 381/13 |
| 4,982,431 | 1/1991 | Tanno | 381/13 |

FOREIGN PATENT DOCUMENTS 0056464  7/1982  European Pat. Off. .
2807600  8/1978  Germany .

Primary Examiner—Stephen Brinich
Attorney, Agent, or Firm—Frishauf, Holtz, Goodman, Langer & Chick

[57] ABSTRACT

In a digital circuit which removes ignition noise from a multiplex signal in a radio receiver, especially in a car radio, the multiplex signal is supplied via a high-pass filter (3) and a squaring or absolute value determing circuit (4) as a digital signal with a sampling frequency that is a multiple of the frequency of the pilot tone. The high-pass filtered and squared or absolute value multiplex signal is compared to a short-time mean value of the high-pass filtered and squared (in absolute value) multiplex signal. A control signal S of predetermined duration is formed when deviations occur that are greater than a preset standard. The control signal S controls a correcting circuit in such a manner that sampling values of the multiplex signal occurring during the control signal are replaced with sampling values occurring during the previous period of the pilot tone, thereby masking the ignition noise.

10 Claims, 1 Drawing Sheet

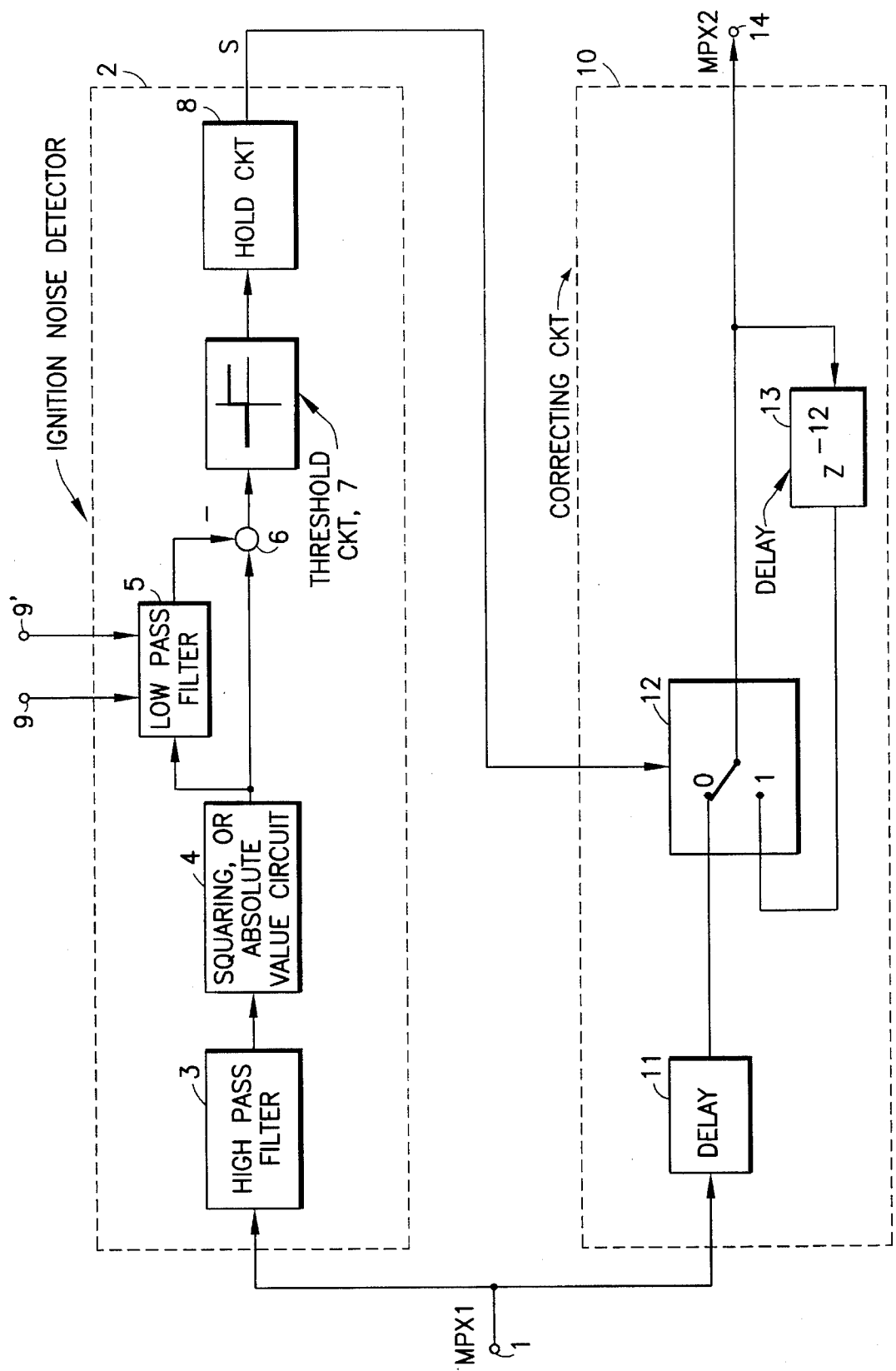

CIRCUIT FOR REMOVING IGNITION NOISE FROM A MULTIPLEX SIGNAL

Cross-reference to related applications, assigned to the assignee of the present invention, the disclosures of which are hereby incorporated by reference:

U.S. Ser. No. 08/183,026, CHAHABADI et al, filed 18 Jan. 1994 now U.S. Pat. No. 5,457,722;
U.S. Ser. No. 08/183,029, VOGT et al, filed 18 Jan. 1994;
U.S. Ser. No. 08/192,505, VOGT et al, filed 3 Feb. 1994 now U.S. Pat. No. 5,442,709;
CHAHABADI & VOGT, U.S. Ser. No. 08/288,555, filed Aug. 10, 1994, now U.S. Pat. No. 5,461,340;

FIELD OF THE INVENTION

The invention relates generally to a circuit for eliminating ignition noise from the multiplex signal of a radio receiver, particularly in a vehicle radio, where such noise is typically encountered.

1. Background

Ignition sparks in internal combustion engines emit short high-frequency pulses over a broad frequency range. These pulses can interfere noticeably with the reception of radio programs. In stereo radio receivers, which may be equipped with devices to decode traffic announcement and radio data signals, the interference occurs in the form of short impulses in a multiplex signal. For the regular analog circuits in radio receivers, is common to "mask" the ignition noise by retaining the previous amplitude of the audio signal for a short time when ignition noise occurs. However, this necessitates the elimination of the pilot tone from the multiplex signal.

2. The Invention

It is an object of the invention to provide a circuit for eliminating ignition noise in a multiplex signal for digital radio receivers. This circuit can remove disturbances in an unchanged multiplex signal using the possibilities offered by digital circuitry.

Briefly, according to the invention, the multiplex signal, which is a digital signal with a sampling frequency that is a multiple of the frequency of the pilot tone, is passed through a high-pass filter and a squaring circuit; then the high-pass-filtered and squared multiplex signal is compared with a short-time mean value of the high-pass filtered and squared multiplex signal. If the deviations are greater than a preset amount, a control signal of a predetermined duration is generated. The control signal controls a corrective circuit such that sampling values of the multiplex signal occurring during the control signal are replaced with sampling values of the pilot tone occurring during the previous period.

The circuit according to the invention has the advantage that it does not require complex removing of the pilot tone from the multiplex signal. Rather, ignition noise is removed from the pilot tone itself. In addition, this circuit takes into account, in an advantageous manner, that the effect of interfering signals—therefore also ignition noise—is proportional to the strength of the received interfering signals.

In one embodiment of the invention, the squaring circuit consists of a circuit for summation. In a refinement of this embodiment, the short time mean value is formed using a low-pass filter, whose limit frequency is in the range between 100 Hz and 1,000 Hz. This allows differentiation of ignition noise from other disturbances on the amplitude of the multiplex signal, when these disturbances are of higher frequencies, e.g. multi-path reception disturbances.

Another refinement of the circuit of the invention consists of a corrective circuit, formed by a first delay device, a controllable changeover switch which can be supplied with the control signal, and a second delay device with a delay of one period of the pilot tone. The first delay device compensates for the coursing time through the high-pass filter (and if necessary through the squaring circuit) and the coursing or processing time for comparing the output voltage with the short-time mean value. The repetition of uninterrupted signal segments achieved by the corrective circuit results in a better corrective effect than merely storing the amplitudes that exist before the occurrence of the ignition noise.

In an advantageous embodiment of this improvement, the controllable switch is a changeover switch that is supplied with the multiplex signal that passes through the first delay device and the multiplex signal that passes through the second delay device. In this embodiment, an output of the changeover switch forms the output of the corrective circuit and is connected with an input of the second delay device.

With such a design, multiple repetition of uninterrupted signal segments is possible, should ignition noise with impulse durations greater than the durations of the periods of the pilot tone occur.

DRAWING

Further features of the preferred embodiment will be apparent from the single Figure, which is a functional block diagram of a circuit according to the invention drawing and are described in greater detail below.

The exemplary embodiment as well as parts thereof are shown as block diagrams. However, this does not imply that the circuit according to the invention is limited to implementation through the conformity of individual blocks to their corresponding circuits. Rather, the circuit according to the invention can be implemented in a particularly advantageous manner using highly integrated circuits. It is possible to employ digital signal processors, which, if programmed accordingly, can perform the processing steps depicted in the block diagrams. Any of the leading digital signal processors commonly used in radio receivers can be suitably programmed. Alternately, the circuit of the invention can form significant portions of a radio receiver, when combined with other circuits as part of an application-specific integrated circuit.

DETAILED DESCRIPTION

The circuit of the present invention is supplied with a digital multiplex signal MPX1 at 1 by a demodulator (not shown). The digital multiplex signal MPX1 has a sampling rate of 228 kHz, or a multiple of the frequency of the pilot tone at 19 kHz. This integral multiple contributes substantially to simple implementation of the circuit of the invention. Circuit 2, indicated by the upper dashed box, detects ignition noise. It consists of a high-pass filter 3, a circuit 4 for example a squaring circuit, a low-pass filter 5, a subtractor 6, a threshold circuit 7, and a hold circuit 8.

Circuit 2 delivers a control signal S to a correcting circuit 10, indicated by the lower dashed box, which consists of a first delay device 11, a controllable changeover switch 12, and a second delay device 13. At output 14 of the corrective circuit 10, a multiplex signal MPX2, from which ignition noise has been eliminated, is made available.

The high-pass filter 3 suppresses the components of the multiplex signal MPX1 which are not relevant to ignition noise. The circuit 4, if a squaring circuit, accomplishes both a quadratic valuation and a rectification or a summation of the high-pass-filtered multiplex signal.

Circuit 4 can also be a circuit which calculates, i.e. determines the absolute value of the high-pass-filtered signal obtained from input 1.

The output signal of the circuit 4 is supplied both to a low-pass filter 5 and to one of the inputs of the subtractor 6. A mean or average value is formed using the low-pass filter, which is preferably an IIR (Infinite Impulse Response) filter of first order with a limit frequency in the range between 100 Hz and 1,000 Hz. From a series of input values x(n), output values y(n) are generated according to the following equation:

$$y(n)=a*y(n-1)+b*x(n).$$

where the coefficients a and b are control values generated by an on-board processor and supplied to the IIR filter via inputs 9 and 9'. These coefficient data determine the amplification and the limit frequency of the low-pass filter, enabling the setting of the sensitivity of the detection circuit. Suitable values are a=0.997 and b=0.03. The limit frequency or the number of the sampling values included in the formation of the mean value are selected in such a manner that those changes, in the amplitude of the output signal of the circuit 4 which are not caused by ignition noise, are passed through by the low-pass filter. Thus, no result is generated at the subsequent subtraction, and no correction is made due to such non-ignition-related amplitude changes.

However, if the output signal of the low-pass filter 5 cannot follow a particular ignition noise, the difference formed by subtractor 6 is so large that the threshold in threshold circuit 7 is exceeded, resulting in, for example, a logic state 1 (HI) at the holding circuit 8. If the holding circuit 8 detects a 1 at the input, a 1 is generated at the output of the holding circuit for a number of sampling values. The number of sampling values is selected in such a manner that the duration of the control signal S is greater than the duration of the occurring ignition noise. In a working exemplary embodiment according to the invention, twelve sampling values were selected that corresponded to around 52 microseconds, or one period of the pilot tone. However, it is not necessary to choose a particular ratio to the period of the pilot tone for the circuit of the present invention.

As long as the control signal S maintains the value 1, the status at the input of the holding circuit 8 is immaterial. After a predetermined time period has expired, the status at the input of holding circuit 8 is rechecked and, if no more noise is detected, the output of the holding circuit 8 changes to logic level 0 (LO).

The control signal S controls the changeover switch 12 in such a manner that, at a logic state 0 of the control signal S, the multiplex signal MPX1, which is supplied to input 1, is supplied to output 14 with merely a delay 11 to compensate for the coursing time in circuits 3 through 8. If the control signal S is at logic state 1, a multiplex signal, delayed at 13 by one period of the pilot tone, is supplied to output 14 via changeover switch 12. As long as the output of holding circuit 8 is at logic level 1, the sampling values of the multiplex signal MPX1, which are interfered with by the ignition noise, are replaced with non-disrupted or undisturbed sampling values of the preceding period of the pilot tone.

What is claimed is:

1. A digital circuit for removing ignition noise from a multiplex signal in a vehicle radio receiver, having a multiplex signal input terminal (1), a noise detection stage (2), and a correcting stage (10), wherein, in accordance with the invention, said noise detection stage operates at a sampling frequency which is a multiple of the frequency of a pilot tone forming part of said multiplex signal, and said noise detection stage includes a high-pass filter (3) connected to said input terminal (1), a circuit (4) connected to the output of said high-pass filter, means (5, 6) for comparing the high-pass filtered and squared multiplex signal to a short-time mean value of the high-pass filtered and squared multiplex signal; and means (7, 8) for generating a control signal (S) of predetermined duration when deviations from said mean value occur that are greater than a predetermined amount;

wherein said correcting stage (10) has a first input connected to said multiplex signal input terminal (1) and a second input connected to the output (S) of said noise detection stage (2); and wherein said correcting stage is responsive to said control signal (S) to replace sampling values of said multiplex signal received during application of said control signal (S), and thus indicated to contain ignition noise, by sampling values occurring during a previous period of the pilot tone, thereby generating an ignition-noise-free multiplex output signal (14).

2. A circuit according to claim 1, wherein the short-time mean value is formed using a low-pass filter (5) whose limit frequency is in a range between 100 Hz and 1,000 Hz.

3. A circuit according to claim 2, wherein said low-pass filter (5) is an Infinite-Impulse-Response (IIR) digital filter.

4. A circuit according to claim 1, wherein the correcting stage (10) includes:

a first delay device (11), which compensates for signal coursing time in the high-pass filter (3), and if necessary in the squaring circuit (4), and for processing time for comparing the output signal with the short-time mean value;

a controllable switch (12) responsive to the control signal from said noise detection stage (2); and a second delay device (13) which causes a delay of one period of the pilot tone.

5. A circuit according to claim 4, wherein the controllable switch is a changeover switch (12), having respective signal inputs which receive the multiplex signal which passes through the first delay device (11) and the multiplex signal that passes through the second delay device (13); and wherein an output of the changeover switch (12) forms the output (14) of the correcting circuit (2) and said second delay device (13) has an input connected to an output of said changeover switch (12), and an output connected to one of said signal inputs of said changeover switch (12).

6. A digital circuit for removing ignition noise from a multiplex signal in a vehicle radio receiver, having a multiplex signal input terminal (1), a noise detection stage (2), and a correcting stage (10), wherein, in accordance with the invention, said noise detection stage operates at a sampling frequency which is a multiple of the frequency of a pilot tone forming part of said multiplex signal, and said noise detection stage includes a high-pass filter (3) connected to said input terminal (1), an absolute value calculating circuit (4) connected to the output of said high-pass filter, means (5, 6) for comparing the high-pass-filtered and absolute value determined multiplex signal to a short-term mean value of the high-pass-filtered and maximum value determined multiplex signal;

means (7, 8) for generating a control signal (S) of predetermined duration when deviations from said mean value occur that are greater than a predetermined amount;

wherein said correcting stage (10) has a first input connected to said multiplex signal input terminal (1) and a second input connected to the output (S) of said noise detection stage (2); and wherein said correcting stage is responsive to said control signal (S) to replace sampling values of said multiplex signal received during application of said control signal (S), and thus indicated to contain ignition noise, by sampling values occurring during a previous period of the pilot tone, thereby generating an ignition-noise-free multiplex output signal (14).

7. A circuit according to claim 6, wherein the short-term mean value is formed using a low-pass filter (5) whose limit frequency is in a range between 100 Hz and 1,000 Hz.

8. A circuit according to claim 7, wherein said low-pass filter (5) is an Infinite-Impulse-Response (IIR) digital filter.

9. A circuit according to claim 6, wherein the correcting stage (10) includes:

a first delay device (11), which compensates for signal coursing time in the high-pass filter (3), and if necessary in the absolute value determination circuit (4), and for processing time for comparing the output signal with the short-time mean value;

a controllable switch (12) responsive to the control signal from said noise detection stage (2); and a second delay device (13) which causes delay of one period of the pilot tone.

10. A circuit according to claim 9, wherein the controllable switch is a changeover switch (12), having respective signal inputs which receive the multiplex signal which passes through the first delay device (11) and the multiplex signal that passes through the second delay device (13);

wherein an output of the changeover switch (12) forms the output (14) of the correcting circuit (2), and wherein said second delay device (13) has an input connected to an output of said changeover switch (12), and an output connected to one of said signal inputs of said changeover switch (12).

* * * * *